United States Patent
Wolf et al.

(10) Patent No.: US 7,042,085 B2
(45) Date of Patent: May 9, 2006

(54) METHOD FOR PACKAGING ELECTRONIC MODULES AND MULTIPLE CHIP PACKAGING

(75) Inventors: Kuno Wolf, Jungingen (DE); Stephan Ernst, Odfildern (DE); Robert Plikat, Ummern (DE); Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/492,269

(22) PCT Filed: Sep. 26, 2002

(86) PCT No.: PCT/DE02/03638

§ 371 (c)(1),
(2), (4) Date: Aug. 23, 2004

(87) PCT Pub. No.: WO03/034495

PCT Pub. Date: Apr. 24, 2003

(65) Prior Publication Data

US 2005/0006758 A1    Jan. 13, 2005

(30) Foreign Application Priority Data

Oct. 9, 2001    (DE) ................ 101 49 774

(51) Int. Cl.
*H01L 23/34* (2006.01)
(52) U.S. Cl. ................ 257/724; 257/725
(58) Field of Classification Search ............ 257/724, 257/725
See application file for complete search history.

(56) References Cited

U.S. PATENT DOCUMENTS

| | | | |
|---|---|---|---|
| 5,012,332 A | | 4/1991 | Guillotte et al. |
| 5,093,713 A | * | 3/1992 | Sawaya ................ 257/724 |
| 5,096,852 A | | 3/1992 | Hobson |
| 5,305,186 A | * | 4/1994 | Appelt et al. ............ 361/704 |
| 5,781,047 A | * | 7/1998 | Shreve et al. ............ 327/110 |
| 6,300,146 B1 | * | 10/2001 | Thierry ................ 438/14 |
| 2002/0190317 A1 | | 12/2002 | Mukherjee et al. |

FOREIGN PATENT DOCUMENTS

| | | |
|---|---|---|
| DE | 15 64 147 | 10/1969 |
| DE | 197 16 674 | 8/1998 |
| DE | 100 22 482 | 12/2000 |
| EP | 0 757 442 | 2/1997 |
| JP | 07 221125 | 8/1995 |

(Continued)

OTHER PUBLICATIONS

Thomas Stockmeier, Power Semiconductor—A Problem or a Resource?, From the State of the Art to Future Trends, PCIM 2000, Conference Proceeding, PC7.2., pp. 195-205.

(Continued)

*Primary Examiner*—Ngân V. Ngô
(74) *Attorney, Agent, or Firm*—Kenyon & Kenyon

(57) ABSTRACT

A method for packaging electronic assemblies and a multiple chip package, at least one power semiconductor chip being applied to a base plate using a first solder, at least one logic chip being applied to the base plate, the logic chip and the base plate being positioned electrically insulated from one another, at least one logic chip being connected to the at least one power semiconductor chip using signal transmission lines, and the electronic assembly including the at least one power semiconductor chip and the at least one logic chip being packaged using a molding compound in order to provide a multiple chip package.

24 Claims, 3 Drawing Sheets

FOREIGN PATENT DOCUMENTS

WO     WO 01/37336     5/2001

OTHER PUBLICATIONS

Peter Van Zant, Michrochip Fabrication, Fourth Edition, McGraw-Hill, 2000, pp. 388-389, pp. 570-571.

* cited by examiner

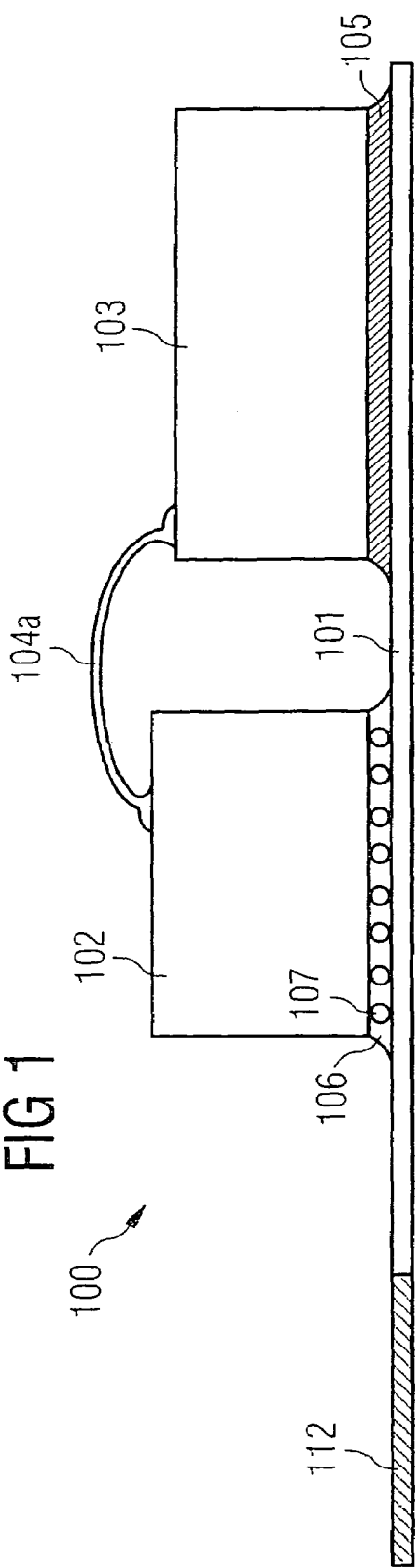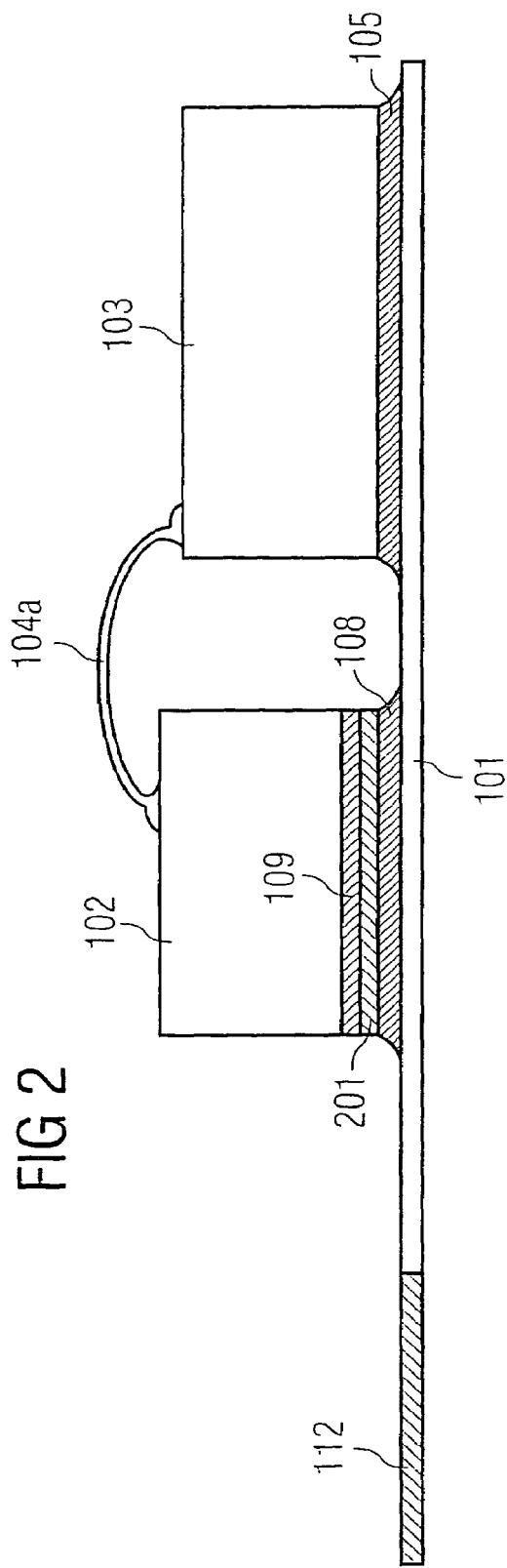

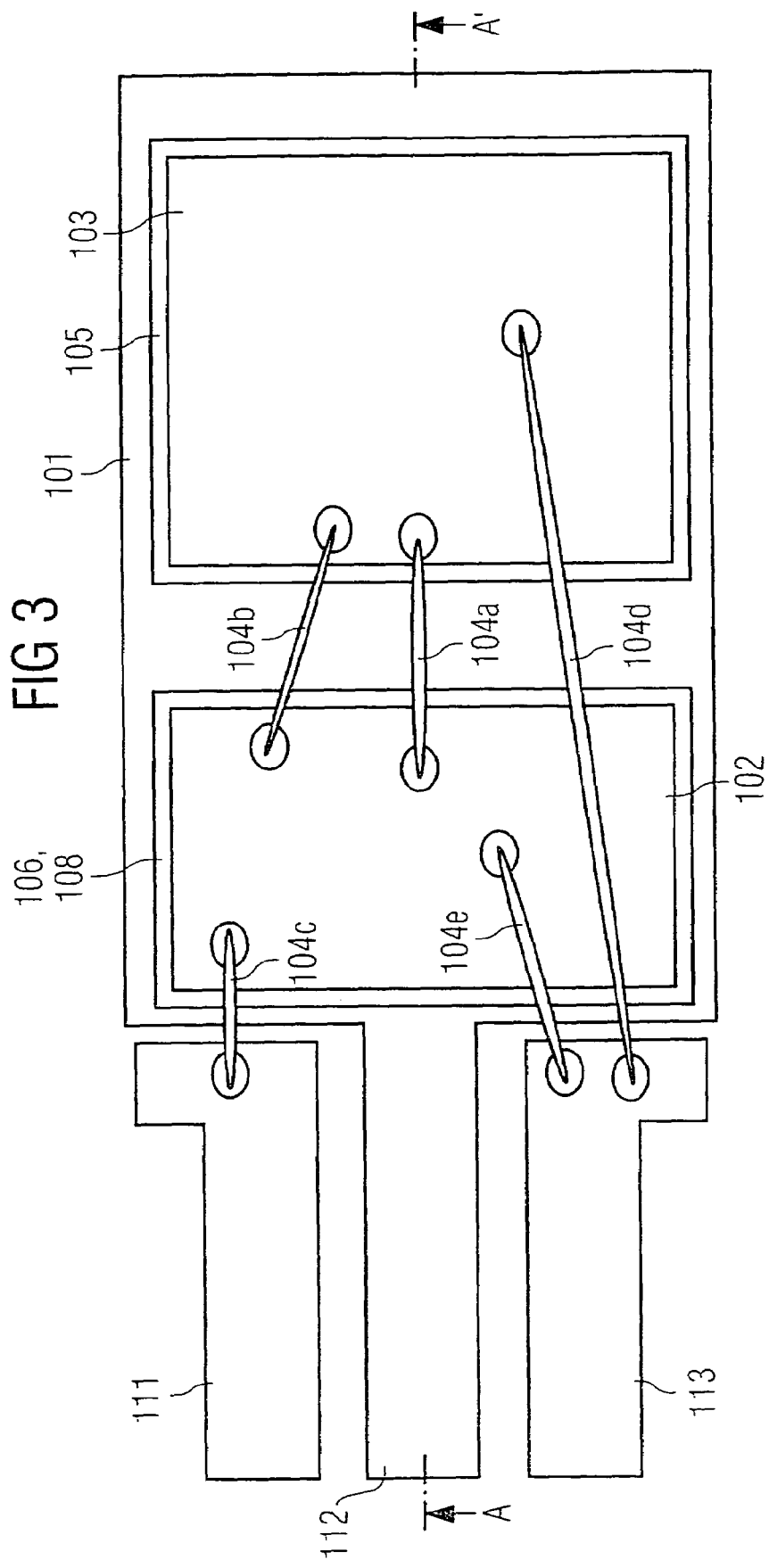

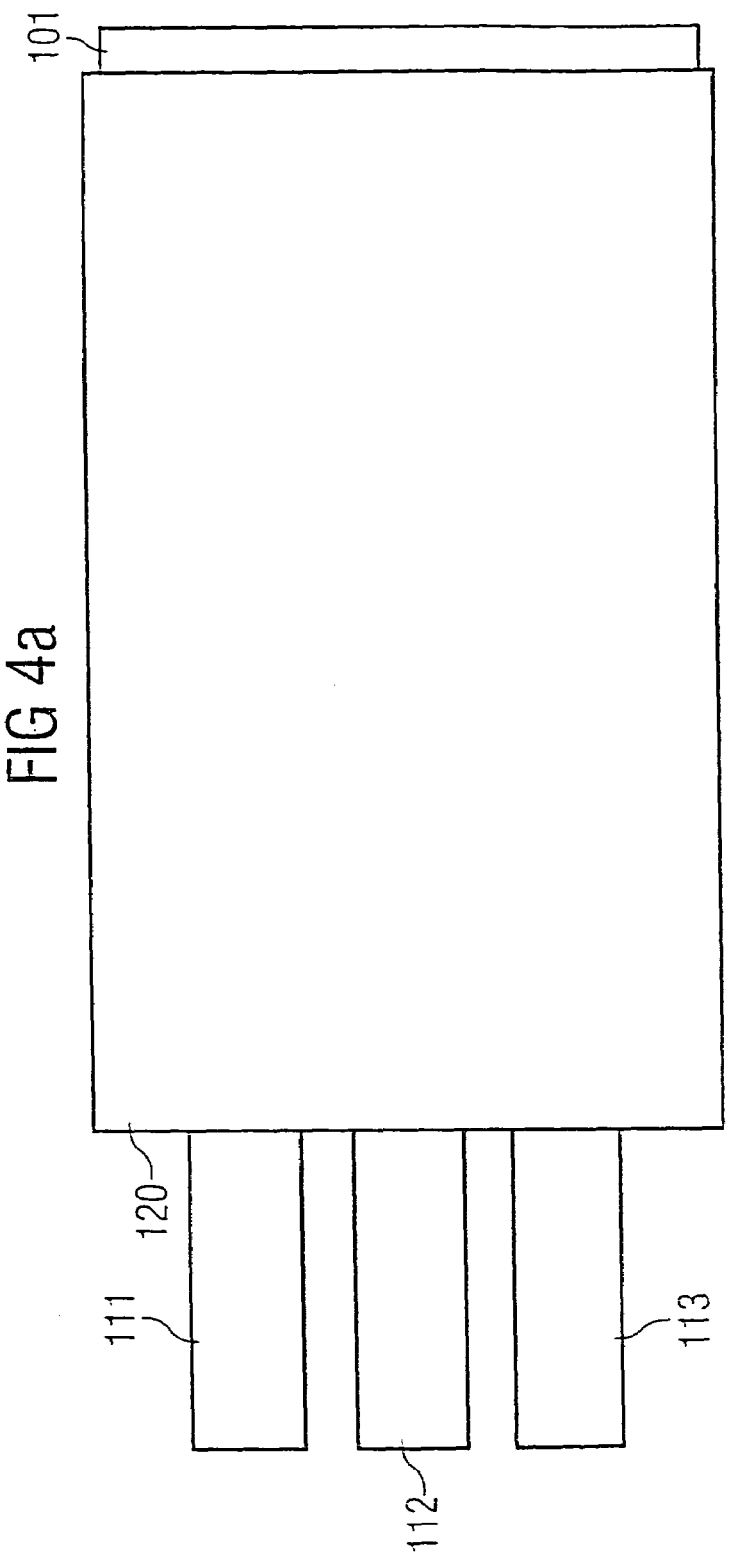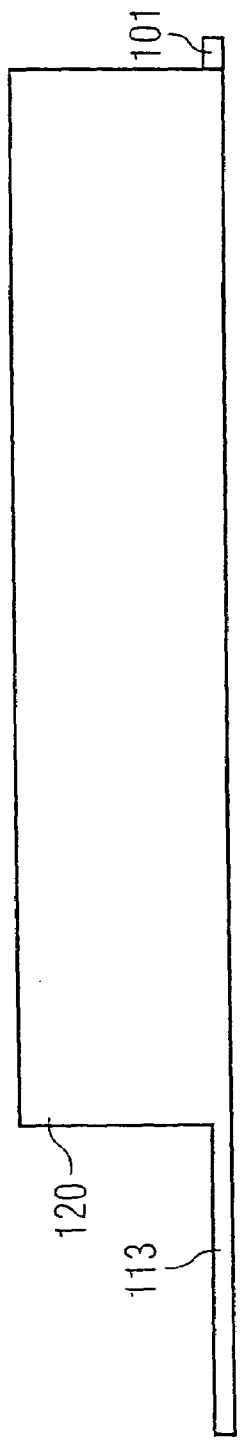

METHOD FOR PACKAGING ELECTRONIC MODULES AND MULTIPLE CHIP PACKAGING

FIELD OF THE INVENTION

The present invention relates to a package of electronic components, and relates to a multiple chip package for packaging electronic assemblies which include at least one power semiconductor chip and at least one logic chip.

BACKGROUND INFORMATION

For the layout of electronic components, e.g., of semiconductor components, power semiconductor chips and logic chips may be embodied as separate chips, because the corresponding semiconductor processes may be optimized individually for both functionalities (functionalities oriented to power semiconductor chips or logic chips).

However, at least one logic chip and at least one power semiconductor chip are typically combined in electronic assemblies in order to execute a specific circuit function.

It is therefore economical for both types of chip, i.e., power semiconductor chips and logic chips, to be able to be integrated as one functional unit in a compact housing and/or in a compact package in order to reduce an overall size and outlay in the use of the electronic assemblies made of logic chips and power semiconductor chips. In this case, the compact housing and/or the compact package is used as protection for the electronic assemblies contained therein from the environmental conditions in an application, but electrical and thermal contacts of the power semiconductor chip and/or the logic chip to one another and to a base plate must be implemented.

In this case, high power losses occur in power semiconductor chips, which must be dissipated via the back of the power semiconductor chip to the environment and/or to a thermally conductive base plate, for example, so that overheating of the power semiconductor chip is avoided.

Typically, power semiconductor chips are soldered onto one side of a base plate, normally made of metal, the base plate being implemented with one or more terminal units in order to electrically couple the power semiconductor chip to external circuit units via its back. Further connection terminals of the power semiconductor chip are provided with metallic contact lugs via further terminal units and led to the outside. After embedding the electronic assembly using a molding compound (e.g., plastic cast and/or plastic casting compound), the terminal units of the power semiconductor chip and the terminal units of the base plate are freely accessible, i.e., the corresponding terminal units are not coated with plastic.

If logic chips are to be positioned together with power semiconductor chips in a single package, other systems provide that the metallic base plate conducts at least one electrical potential of at least one power semiconductor chip; in this case potential differences and/or voltages of several hundred volts may arise, which may impair the functionality of logic chips and/or may even completely destroy the logic chip.

Furthermore, these voltages may exhibit strong transient oscillations, which leads to the logic chips having to resist high transient voltages. This requires complex shielding measures on the logic chip.

The semiconductor process used to produce a logic chip must also be configured for high blocking voltages, which is not expedient.

A method which attempts to avoid this problem is discussed in German Published Patent Application No. 197 16 674. In this case, the circuit modules packed in the housing (logic chips and power semiconductor chips) are distributed onto multiple base plates which are electrically insulated from one another, whereby it is possible to keep high voltages and/or potential differences away from the sensitive logic chips. The above-mentioned method provides that multiple base plates which are electrically insulated from one another must be positioned next to one another in the housing, so that for a predetermined area, only a smaller total component area may be packed than if only one (electrically conductive, metallic) base plate is provided, since the circuit modules must have a sufficient insulation distance from one another and from the edge of a base plate.

A further method and a device for packaging circuit modules is discussed in PCIM 200, Conference Proceedings, PC7.2, "Power Semiconductor Packaging—Problem or resource?, From the state of the art to future trends", a metal-plated ceramic base plate being used instead of a metallic base plate in this case.

Through targeted structuring of the metal plating on the base plate, electrical isolation of the backs of power and/or logic chips may be achieved. This method and this device provide that a ceramic reduces the thermal conductivity of the package, making heat dissipation from the circuit modules more difficult. The above-mentioned method provides for complex manufacturing of the ceramic, due to which the module package is associated with higher costs than a module package which is based on a single metallic base plate.

It is therefore an object of the present invention to provide a method for packaging circuit modules and a multiple chip package, at least one logic chip and at least one power semiconductor chip being combined on a uniform metallic base plate in a multiple chip package.

SUMMARY

The exemplary method of the present invention provides a method for packaging electronic assemblies and multiple chip packages.

The exemplary embodiment of the present invention provides that different circuit modules, such as logic chips and power semiconductor chips, may be combined in a shared package, the at least one logic chip and the at least one power semiconductor chip being positioned on a shared, generally metallic base plate.

The exemplary embodiment of the present invention provides that for a predetermined housing size, a larger total chip area is packable than may be implemented for packages according to other systems using separate base plates for the individual modules.

The method according to the present invention for packaging electronic assemblies has the following steps:

a) applying at least one power semiconductor chip to a base plate using a first solder;

b) applying at least one logic chip to the base plate, the logic chip and the base plate being positioned in such a manner that electrical insulation is provided between the at least one logic chip and the base plate;

c) connecting the at least one logic chip to the at least one power semiconductor chip using signal transmission lines and connecting both the at least one logic chip and the at least one power semiconductor chip to corresponding first and second terminal units; and d) packaging the electronic assembly including the at least one power semiconductor chip and the at least one logic chip using a molding compound and/or a plastic cast in order to obtain a multiple chip package and protect the power semiconductor chips and logic chips in the multiple chip package from environmental influences.

First and second terminal units for connecting power semiconductor chips and logic chips and at least one base plate terminal unit for electrically connecting the base plate are left exposed.

According to an exemplary embodiment of the present invention, electrical insulation of the logic chip from the base plate is provided by a dielectric coating applied to the logic chip. The dielectric coating, i.e., the dielectric insulation coating insulates parts or all of the logic chip from the base plate, a metal plating being provided on the dielectric coating for a soldered connection of the logic chip layered system to the metallic base plate.

According to a further exemplary embodiment of the present invention, electrical insulation of the logic chip from the base plate is provided by gluing the logic chip onto the base plate using an electrically insulating adhesive. Parts or all of the logic chip are expediently insulated by the adhesive coating between the logic chip and the metallic base plate.

According to yet a further exemplary embodiment of the present invention, electrically insulating spacers are introduced into an adhesive coating made of the adhesive in order to provide uniform spacing between the logic chip and the base plate for electrical insulation of the logic chip from the base plate.

According to yet a further exemplary embodiment of the present invention, the at least one logic chip is soldered onto the base plate using a metal plating applied to the dielectric coating of the logic chip and using a second solder. A reliable soldered connection is provided by the second solder, reliable electrical insulation between the logic chip and the base plate being ensured by the dielectric coating. The dielectric coating and the metal plating are applied sequentially on one side (for example the bottom) of the logic chip in a coating process.

According to yet a further exemplary embodiment of the present invention, high thermal conductivity is provided between the power semiconductor chip and the base plate by the first solder. Thermal energy is dissipated from the power semiconductor chip to the base plate in this manner, whereby cooling of the power semiconductor chip is achieved.

According to yet a further exemplary embodiment of the present invention, high electrical conductivity is provided between the power semiconductor chip and the base plate by the first solder. Current conduction without a noticeable voltage drop is provided between the power semiconductor chip and the base plate by the first solder, because the first solder has a low electrical resistance.

According to yet a further exemplary embodiment of the present invention, electrical insulation of the logic chip from the base plate is provided by an SOI substrate, a silicon application on an insulator (silicon on insulator) being referred to as SOI.

According to yet a further exemplary embodiment of the present invention, a power semiconductor chip is combined with at least two different logic chips in the multiple chip package according to the present invention in order to provide a multiple chip package. Combinations of adhesive bonds of the at least one logic chip to the base plate and soldered connections between the base plate and a metal plating applied to the dielectric coating of at least one further logic chip are provided for this purpose.

Furthermore, the multiple chip package according to the present invention has:
a) a base plate, which may be implemented as a unit made of a metallic material, such as copper;
b) at least one logic chip positioned on the base plate, the at least one logic chip being glued onto the base plate in an electrically insulating manner using an adhesive;
c) at least one power semiconductor chip positioned on the base plate, the at least one power semiconductor chip being soldered onto the base plate using an electrically and thermally conductive solder;
d) signal transmission lines for electrically connecting the logic chip to the power semiconductor chip and for electrically connecting the logic chip and the power semiconductor chip to first and second terminal units; and
e) a molding compound as a plastic casting compound for packaging the electronic assembly, which includes the base plate, the at least one power semiconductor chip, and the at least one logic chip, in order to protect it from environmental influences.

Furthermore, the multiple chip package according to the present invention includes at least one logic chip positioned on the base plate instead of the above-mentioned feature b), the at least one logic chip being coated using a dielectric coating for electrical insulation of at least parts of the logic chip from the base plate, the dielectric coating being coated with a metal plating, and the metal plating being soldered to the base plate using a second solder.

Furthermore, the multiple chip package according to the present invention has:
a) a base plate;
b) at least one logic chip positioned on the base plate, the at least one logic chip being glued to the base plate in an electrically insulating manner using an adhesive and electrically insulating spacers;
c) at least one logic chip positioned on the base plate, the at least one logic chip being coated with a dielectric coating for dielectric insulation of at least parts of the logic chip from the base plate, the dielectric coating being coated with a metal plating, and the metal plating being soldered onto the base plate using a second solder;
d) at least one power semiconductor chip positioned on the base plate, the at least one power semiconductor chip being soldered onto the base plate using an electrically and thermally conductive solder;
e) signal transmission lines for electrically connecting the logic chip to the power semiconductor chip and for connecting the logic chip and the power semiconductor chip to first and second terminal units; and
f) a molding compound and/or a plastic cast for packaging the electronic assembly, which includes the base plate, the at least one power semiconductor chip, and the at least one logic chip, in order to protect it from damaging environmental influences.

BRIEF DESCRIPTION OF THE DRAWINGS

FIG. 1 shows a multiple chip package without molding compound and without a plastic cast including a logic chip and a power semiconductor chip which are connected by signal transmission lines and are positioned on a base plate, as a side sectional view along a line A–A' of FIG. 3 according to an exemplary embodiment of the present invention.

FIG. 2 shows a multiple chip package in a side sectional view along a line A–A' of FIG. 3 according to a further exemplary embodiment of the present invention.

FIG. 3 shows a top view of a multiple chip package according to an exemplary embodiment of the present invention.

FIG. 4a shows a top view of a multiple chip package including an applied molding compound and/or an applied plastic cast according to an exemplary embodiment of the present invention.

FIG. 4b shows a side view of a multiple chip package including an applied molding compound and/or an applied plastic cast of FIG. 4a according to an exemplary embodiment of the present invention.

DETAILED DESCRIPTION

In the figures, identical reference numbers identify identical or functionally identical components.

In the side sectional view of a multiple chip package shown in FIG. 1, molding compound or plastic cast 120 (explained below with reference to FIGS. 4a and 4b) is omitted for reasons of viewability. The multiple chip package shown includes two circuit modules, i.e., a logic chip 102 and a power semiconductor chip 103, which are positioned according to the present invention on a shared base plate 101. To dissipate the heat generated in power semiconductor chip 103 and to transmit high currents with a low transmission resistance (voltage drop), power semiconductor chip 103 is connected to base plate 101, which is generally implemented as a metallic base plate, using the highest possible thermal and electrical conductivities. As shown in FIG. 1, power semiconductor chip 103 is soldered onto base plate 101 using a first solder 105 (hatched in FIG. 1).

The base plate includes a base plate terminal unit 112, left exposed after embedding the overall system using a molding compound, which provides one of multiple possible electrical connections to power semiconductor chip 103.

Furthermore, a logic chip 102 is shown in FIG. 1, which, as noted above, is isolated from the electrical potential of power semiconductor chip 103 carried by base plate 101. In the exemplary embodiment of the present invention shown in FIG. 1, this is achieved in that logic chip 102 is glued onto base plate 101 using an adhesive 106, which is electrically insulating. For precise layout of a uniform spacing between logic chip 102 and base plate 101 and to ensure sufficient insulation, spacers 107, which are themselves electrically insulating, are introduced into the adhesive coating.

One of multiple signal transmission lines is shown as a signal transmission line 104a for electrically connecting power semiconductor chip 103 to logic chip 102. Further signal transmission lines are used for connecting each of logic chip 102 and power semiconductor chip 103 to first and second terminal units 111 and 113 (shown in FIG. 3). In this manner, a multiple chip package 100 including two circuit modules, logic chip 102 and power semiconductor chip 103, for example, is achieved in an compact construction and housing form.

FIG. 2 illustrates a further exemplary embodiment of the present invention, two circuit modules, i.e., a logic chip 102 and a power semiconductor chip 103, which are connected to one another by a signal transmission line 104a, again being shown for exemplary purposes in FIG. 2. The application of power semiconductor chip 103 to base plate 101 is implemented as shown with reference to FIG. 1, while logic chip 102 is applied in a different, electrically insulating manner to uniform, metallic base plate 101. A dielectric coating 109, which is electrically insulating, is applied to the bottom of logic chip 102. A metal plating 201, which is used as a solderable connection element to metallic base plate 101, is applied to this dielectric coating 109.

Therefore, it is possible to solder logic chip 102 onto base plate 101 in an electrically insulating manner using a second solder 108, a soldered connection only being provided between metal plating 201 and metallic base plate 101. A uniform, flat dielectric coating 109 may be provided by a thermal oxidation process or a deposition process during the chip manufacturing, for example. A further possibility is to use an SOI substrate (silicon on insulator) for the manufacture of the logic chip. In this case, a semiconductor material is located above and below dielectric coating 109, and metal plating 201 is applied to the bottom of the semiconductor material positioned below dielectric coating 109.

FIG. 3 shows a multiple chip package 100, in which a logic chip 102 and a power semiconductor chip 103 are included, in a top view, a molding compound 120 being omitted for reasons of viewability. As shown in FIG. 3, signal transmission lines 104a and 104b are used for electrically connecting logic chip 102 to power semiconductor chip 103, while signal transmission lines 104c and 104e are used for electrically connecting the logic chip to first and second terminal units 111 and 113. A signal transmission line 104d is used for connecting power semiconductor chip 103 to second terminal unit 113.

A further connection of power semiconductor chip 103 to base plate terminal unit 112 is implemented via the base plate in that power semiconductor chip 103 is soldered using an electrically conductive adhesive 105 onto base plate 101, as described above with reference to FIG. 1. It is to be noted that signal transmission lines 104a through 104e are only exemplary, i.e., there may be more or less than five signal transmission lines 104a through 104e.

Power semiconductor chip 103 may be implemented, for example, as an IGBT ("insulated gate bipolar transistor") for ignition applications, logic chip 102 including the associated logic circuit, an ESD (electrostatic discharge) protective circuit and a current regulating circuit. In this example, base plate terminal unit 112 provides a terminal lug connected to a collector of the IGBT, to which an ignition coil may be connected, second terminal unit 113 lying at a reference potential and first terminal unit 111 being used as a control terminal.

The control signal applied to first terminal unit 111 is relayed via signal transmission line 104c, logic chip 102, and signal transmission line 104a to the gate of the IGBT (power semiconductor chip 103). A signal proportional to the coil current of the ignition coil is returned by IGBT 103 via signal transmission line 104b to the current regulation circuit implemented on logic chip 102. This circuit may prevent a limiting value of the coil current flowing through the ignition coil from being exceeded by reducing the gate voltage provided to the IGBT via signal transmission line 104a.

FIGS. 4a and 4b show a multiple chip package 100 including an applied molding compound 120 and/or an applied plastic cast, so that a complete package of the circuit modules shown with reference to FIGS. 1 through 3, i.e., logic chip 102 and power semiconductor 103, is provided. In this case, a side view of FIG. 4a is shown in FIG. 4b.

It is to be noted that molding compound 120 for packaging the electronic assembly including at least one power semiconductor chip 103 and at least one logic chip 102 leaves at least one base plate terminal unit 112 of base plate 101 and the ends of first and second terminal units 111 and/or 113 pointing away from modules 102 and/or 103 exposed. Base plate 101 has high electrical and thermal conductivities itself, the base plate being made of a metallic material such as copper or a copper alloy. External circuit units may be connected to base plate terminal unit 112 and to first terminal unit 111 and second terminal unit 113.

Through the method according to the present invention for packaging electronic assemblies, power semiconductor chips and logic chips being combinable, and through the multiple chip package according to the present invention, a system of individual circuit modules on a uniform base plate is simplified, and a housing and/or a package may be laid out in a more compact form, whereby a significant economic advantage is achieved during manufacture of the multiple chip package.

What is claimed is:

1. A multiple chip package, comprising:
    a base plate;
    at least one logic chip arranged on the base plate, the at least one logic chip being glued in an electrically insulating manner on the base plate with an electrically insulating adhesive and with electrically insulating spacers;
    at least one power semiconductor chip arranged on the base plate, the at least one power semiconductor chip being soldered onto the base plate with an electrically and thermally conductive solder;
    signal transmission lines for electrically connecting the at least one logic chip to the at least one power semiconductor chip, and the at least one logic chip and the at least one power semiconductor chip to a first terminal unit and a second terminal unit; and
    a molding compound for packaging an electronic assembly including the base plate, the at least one power semiconductor chip, and the at least one logic chip.

2. A multiple chip package, comprising:
    a base plate;
    at least one logic chip arranged on the base plate, the at least one logic chip being coated with a dielectric coating for electrical insulation of at least parts of the at least one logic chip from the base plate, the dielectric coating being coated with a metal plating, and the metal plating being soldered onto the base plate with a second solder;
    at least one power semiconductor chip arranged on the base plate, the at least one power semiconductor chip being soldered onto the base plate with an electrically and thermally conductive solder;
    signal transmission lines for electrically connecting the at least one logic chip to the at least one power semiconductor chip, and the at least one logic chip and the at least one power semiconductor chip to a first terminal unit and a second terminal unit; and
    a molding compound for packaging an electronic assembly including the base plate, the at least one power semiconductor chip, and the at least one logic chip.

3. A multiple chip package, comprising:
    a base plate;
    at least one logic chip arranged on the base plate, the at least one logic chip being glued in an electrically insulating manner on the base plate with an electrically insulating adhesive and with electrically insulating spacers, the at least one logic chip arranged on the base plate, the at least one logic chip being coated with a dielectric coating for electrical insulation of at least parts of the at least another logic chip from the base plate, the dielectric coating being coated with a metal plating, and the metal plating being soldered onto the base plate with a second solder;
    at least one power semiconductor chip arranged on the base plate, the at least one power semiconductor chip being soldered onto the base plate with an electrically and thermally conductive solder;
    signal transmission lines for electrically connecting the at least one logic chip to the at least one power semiconductor chip, and the at least one logic chip and the at least one power semiconductor chip to a first terminal unit and a second terminal unit; and
    a molding compound for packaging an electronic assembly including the base plate, the at least one power semiconductor chip, and the at least one logic chip.

4. The multiple chip package of claim 3, wherein electrically insulating spacers are introduced into the electrically insulated adhesive that glues the at least one logic chip onto the base plate.

5. The multiple chip package of claim 3, wherein the molding compound leaves at least one base plate terminal unit of the base plate and ends of the first terminal unit and the second terminal unit pointing away from the at least one logic chip and the at least one power semiconductor chip.

6. The multiple chip package of claim 3, wherein the base plate has high electrical and thermal conductivities.

7. The multiple chip package of claim 3, wherein the base plate includes a metallic material.

8. The multiple chip package of claim 3, wherein the base plate includes one of copper and a copper alloy.

9. The multiple chip package of claim 3, wherein the base plate includes a base plate terminal unit for connecting external circuit units.

10. The multiple chip package of claim 3, wherein the at least one power semiconductor chip includes an insulated gate bipolar transistor (IGBT).

11. The multiple chip package of claim 1, wherein electrically insulating spacers are introduced into the electrically insulated adhesive that glues the at least one logic chip onto the base plate.

12. The multiple chip package of claim 1, wherein the molding compound leaves at least one base plate terminal unit of the base plate and ends of the first terminal unit and the second terminal unit pointing away from the at least one logic chip and the at least one power semiconductor chip.

13. The multiple chip package of claim 1, wherein the base plate has high electrical and thermal conductivities.

14. The multiple chip package of claim 1, wherein the base plate includes a metallic material.

15. The multiple chip package of claim 1, wherein the base plate includes one of copper and a copper alloy.

16. The multiple chip package of claim 1, wherein the base plate includes a base plate terminal unit for connecting external circuit units.

17. The multiple chip package of claim 1, wherein the at least one power semiconductor chip includes an insulated gate bipolar transistor (IGBT).

18. The multiple chip package of claim 2, wherein electrically insulating spacers are introduced into the electrically insulated adhesive that glues the at least one logic chip onto the base plate.

19. The multiple chip package of claim 2, wherein the molding compound leaves at least one base plate terminal unit of the base plate and ends of the first terminal unit and the second terminal unit pointing away from the at least one logic chip and the at least one power semiconductor chip.

20. The multiple chip package of claim 2, wherein the base plate has high electrical and thermal conductivities.

21. The multiple chip package of claim 2, wherein the base plate includes a metallic material.

22. The multiple chip package of claim 2, wherein the base plate includes one of copper and a copper alloy.

23. The multiple chip package of claim 2, wherein the base plate includes a base plate terminal unit for connecting external circuit units.

24. The multiple chip package of claim 2, wherein the at least one power semiconductor chip includes an insulated gate bipolar transistor (IGBT).

* * * * *